United States Patent
Kawashima

[11] Patent Number: 5,937,327
[45] Date of Patent: Aug. 10, 1999

[54] METHOD FOR IMPROVING WIRING CONTACT IN SEMICONDUCTOR DEVICES

[75] Inventor: Ikue Kawashima, Kobe, Japan

[73] Assignees: Ricoh Company, Ltd., Tokyo, Japan; Ricoh Research Institute of General Electronics Co., Ltd., Miyagi, Japan

[21] Appl. No.: 08/803,953

[22] Filed: Feb. 25, 1997

Related U.S. Application Data

[63] Continuation of application No. 08/462,607, Jun. 5, 1995, abandoned, which is a continuation-in-part of application No. 08/219,707, Mar. 29, 1994, abandoned.

[30] Foreign Application Priority Data

Apr. 23, 1993 [JP] Japan ..................... 5-120659

[51] Int. Cl.⁶ ........................... H01L 21/467
[52] U.S. Cl. ............... 438/673; 438/725; 438/720; 438/669
[58] Field of Search .............. 438/673, 688, 438/675, 669, 701, 717, 725, 671, 720

[56] References Cited

U.S. PATENT DOCUMENTS

| | | | |
|---|---|---|---|
| 4,541,893 | 9/1985 | Knight . | |
| 4,728,627 | 3/1988 | Mase et al. . | |
| 4,891,094 | 1/1990 | Waldo, III | 156/626.1 |
| 4,924,295 | 5/1990 | Kuecher . | |
| 4,962,060 | 10/1990 | Sliwa et al. | 437/192 |
| 5,244,534 | 9/1993 | Yu et al. . | |
| 5,443,941 | 8/1995 | Bariya et al. | 430/313 |
| 5,637,534 | 6/1997 | Takeyasu et al. . | |

FOREIGN PATENT DOCUMENTS

| | | | |
|---|---|---|---|
| 60-173857 | 9/1985 | Japan | H01L 21/88 |
| 4-17329 | 1/1992 | Japan | H01L 21/285 |
| 4-10219 | 2/1992 | Japan | H01L 21/285 |

OTHER PUBLICATIONS

U.S. Serial No. 08/027985 filed on Mar. 8, 1993.

*Primary Examiner*—Caridad Everhart
*Attorney, Agent, or Firm*—Cooper & Dunham LLP

[57] ABSTRACT

A conductive material is buried into a hole portion of a layer insulating film. A contact portion of the buried conductive material coming in contact with an upper wiring is formed in a convex or concave shape. Materials of the buried conductive material and the upper wiring are selected such that these materials are different from each other. When an upper face of an opening portion of the buried conductive material in a hole portion is formed in a conical shape and $\alpha$ is set to an angle formed between a surface of the insulating film and a conical slanting face of the upper face of the buried conductive material, a contact area between the buried conductive material and an upper wiring member is equal to $1/\cos\alpha$ times a contact area between the buried conductive material and the upper wiring member provided in a case in which the upper face of the buried conductive material is formed in the shape of a flat face. In this structure, no contact area between the buried conductive material and the upper wiring member is greatly reduced even when a shift in position between the hole and the upper wiring member is caused.

2 Claims, 5 Drawing Sheets

METHOD FOR IMPROVING WIRING CONTACT IN SEMICONDUCTOR DEVICES

CROSS REFERENCE TO RELATED APPLICATIONS

This is a continuation of application Ser. No. 08/462,607 filed Jun. 5, 1995 now abandoned, which is a continuation-in-part of Ser. No. 08/219,707 filed Mar. 29, 1994, now abandoned.

BACKGROUND OF THE INVENTION

1. Field of the Invention

The present invention relates to a semiconductor device and a manufacturing method thereof. More particularly, the present invention relates to a semiconductor device and a manufacturing method thereof characterized in a connection portion between a lower wiring or a semiconductor element portion and an upper wiring.

2. Description of the Related Art

The diameters of a contact hole and a through hole are reduced as a semiconductor device is integrated. Further, a wiring width is reduced.

In an integrated circuit, a transistor must be electrically connected to lower and upper wirings in a wiring section or a multilayer wiring structure. In a general semiconductor device, contact and through holes are formed in a layer insulating film. The transistor and the upper and lower wirings are connected to each other through these contact and through holes. In a connection portion of the transistor and the upper and lower wirings, as shown in FIG. 1a, the width of an upper wiring 4 is set to be wider than a diameter of each of a contact hole and a through hole 2 so as to prevent the upper wiring 4 from being cut at connecting stages, etc.

However, as the diameters of the contact and through holes are reduced and the wiring width is reduced, wirings are cut at connecting stages in contact and through hole portions in many cases, thereby reducing reliability in wiring.

In one method for improving wiring reliability in the connection portion, a buried conductive material is formed in each of the contact and through holes to reduce a step difference between wirings in the connection portion. For example, such a method is proposed in Japanese Patent Publication (KOKOKU) No. 410219 and Japanese Patent Application Laying Open (KOKAI) No. 4-17329. In Japanese Patent Publication (KOKOKU) No. 4-10219, tungsten is selectively grown in an opening of an insulating film formed on a silicon substrate so that this opening is buried by this tungsten. Thus, the insulating film is flattened and an aluminum wiring is formed on this insulating film. In Japanese Patent Application Laying Open (KOKAI) No. 4-17329, a first aluminum film is formed in a substrate opening portion by a selective growing method so that a surface of the substrate opening portion is flattened. Thereafter, energy particles are irradiated onto a surface of an insulating film so that an aluminum film is also grown on the insulating film, thereby forming a second aluminum film.

These methods for burying each of the contact and through holes by a conductive material are useful to improve wiring reliability. Further, there is no fear of cutting wirings at connecting stages in these methods. Accordingly, as shown in FIG. 1a, it is not necessary to widen the wiring width in only the connection portion. Therefore, it is possible to reduce distances between adjacent wirings so that it is useful to reduce the size of a semiconductor element.

However, as the diameters of the contact and through holes are reduced and the wiring width is reduced, a new problem is caused when a position of the upper wiring is shifted from each of the contact and through holes. For example, this problem will be described with respect to the through hole and the upper wiring. When the through hole has a square shape having 0.4 $\mu$m on one side thereof and the width of the upper wiring is set to 0.4 $\mu$m and there is no shift in position between the through hole and the upper wiring 4 as shown in FIG. 1b, a contact surface between the upper metallic wiring 4 and a buried metal is equal to a surface area provided by a diameter of the through hole. However, if there is a shift in position between the upper wiring and the through hole and this shift is equal to 0.2 $\mu$m for example, the contact area between the upper wiring 4 and the buried metal is reduced by 50% as shown in FIG. 1c in comparison with the case in which no position shift is caused. Accordingly, when an electric current flows through the through hole, there is a fear of fusion or melting, etc.

When the buried conductive material and an upper wiring material are constructed by the same material as shown in Japanese Patent Application Laying Open (KOKAI) No. 4-17329 and the position shift is caused, the buried conductive material is also etched when a pattern of the upper metallic wiring is formed by etching. Accordingly, reliability of each of the contact and through holes is greatly reduced.

SUMMARY OF THE INVENTION

It is therefore a first object of the present invention to provide a semiconductor device in which a conductive material is buried into each of through and contact holes and no contact area between the buried conductive material and an upper wiring is greatly reduced even when there is a shift in position between the upper wiring and each of the through and contact holes.

A second object of the present invention is to provide a manufacturing method of a semiconductor device for improving reliability of a connection portion.

The above first object of the present invention can be achieved by a semiconductor device having a connection portion in which a hole is formed in one portion of an insulating layer for electrically insulating a lower wiring or a semiconductor element portion from an upper wiring and is buried by a conductive material for electrically connecting the lower wiring or the semiconductor element portion to the upper wiring; the semiconductor device being constructed such that materials of the buried conductive material and the upper wiring are different from each other and a contact portion of the buried conductive material coming in contact with the upper wiring is formed in a convex or concave shape.

In this semiconductor device, a width of the upper wiring on the buried conductive material is preferably wider than that of the upper wiring on a portion except for the buried conductive material.

The above second object of the present invention can be achieved by a manufacturing method of a semiconductor device for forming a connection portion, comprising the following steps (A) to (E): (A) a process for depositing an insulating film on a lower wiring or a semiconductor element and forming a hole in a portion for forming the connection portion between the insulating film and an upper wiring formed later; (8) a process for forming a first metal within the hole and burying the hole by the first metal such that the height of an end portion of a hole opening portion of the first metal is approximately equal to the height of a planar portion of the insulating film and a central portion of the hole opening portion is formed in a convex or concave shape; (C) a process for depositing a film of a second metal different from the first metal on the first metal and the insulating film; (D) a process for forming a resist film on the second metallic film and patterning the resist film to form the upper wiring; and (E) a process for etching and patterning the second metallic film as the second metallic film onto the upper wiring with the resist pattern as a mask.

In this manufacturing method, a thickness of the resist film in a portion situated above the hole is different from that in another portion. In the case of a positive type resist, the thickness of the resist film in the portion situated above the hole is set to a value near a local maximum point of a swing curve. On the other hand, in the case of a negative type resist, the thickness of the resist film in the portion situated above the hole is set to a value near a local minimum point of a swing curve.

In the semiconductor device, the conductive material is buried into each of through and contact holes and no contact area between the buried conductive material and the upper wiring is greatly reduced even when there is a shift in position between the upper wiring and each of the through and contact holes.

In the manufacturing method, reliability of the connection portion is improved.

Further objects and advantages of the present invention will be apparent from the following description of the preferred embodiments of the present invention as illustrated in the accompanying drawings.

BRIEF DESCRIPTION OF THE DRAWINGS

FIG. 5b is a plan view showing effects of the present invention in a state in which the upper wiring is formed in a masking position shown in FIG. 5a.

DESCRIPTION OF THE PREFERRED EMBODIMENTS

The preferred embodiments of a semiconductor device and a manufacturing method thereof in the present invention will next be described in detail with reference to the accompanying drawings.

Figure 2A:
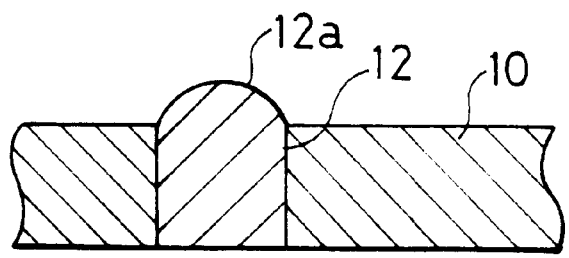
FIG. 2a is a cross-sectional view showing a buried conductive material in a connection portion in the present invention in an example in which an upper end face of the buried conductive material is formed in a convex shape.
Figure 2B:
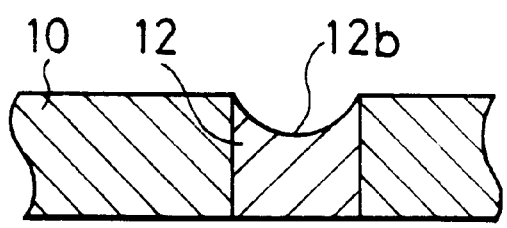
FIG. 2b is a cross-sectional view showing a buried conductive material in a connection portion in the present invention in an example in which an upper end face of the buried conductive material is formed in a concave shape.

As illustrated in FIGS. 2a or 2b showing a connecting portion in a semiconductor device of the present invention, a conductive material 12 is buried into each of a contact hole and a through hole of a layer insulating film 10 such as a silicon oxide film, a BPSG film, a PSG film, etc. The layer insulating film 10 electrically insulates an upper wiring from a lower wiring or a semiconductor element portion. A contact portion of the buried conductive material 12 coming in contact with the upper wiring is formed in a convex shape 12a or a concave shape 12b. The buried conductive material 12 can be constructed by using tungsten, polysilicon, aluminum, copper, a chemical compound of these elements, or an alloy, etc. The upper wiring is electrically connected to the lower wiring or the semiconductor element through this buried conductive material 12. A material of the upper wiring can be constructed by using polysilicon, Mosi, WSi, TiSi, tungsten, aluminum, copper, a chemical compound of these elements, or an alloy, etc. The buried conductive material 12 and the upper wiring material are selected such that these materials are different from each other.

Figure 1A:
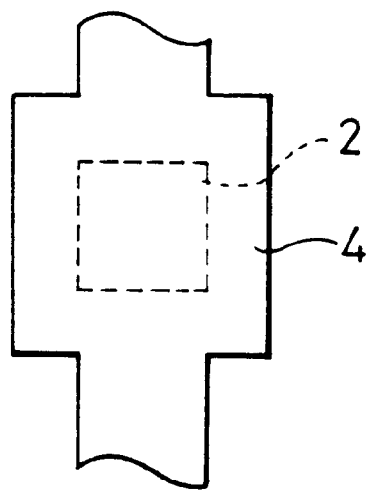
FIG. 1a is a plan view schematically showing a general wiring connection portion in an example in which a wiring width of the connection portion is widened.
Figure 1B:
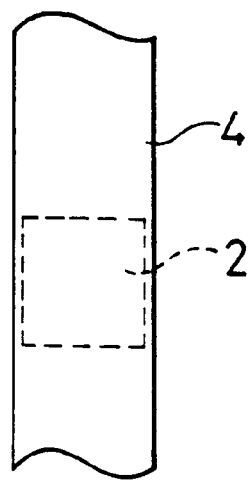
FIG. 1b is a plan view schematically showing a general wiring connection portion in an example in which the diameter of a hole is equal to the width of an upper wiring.
Figure 1C:
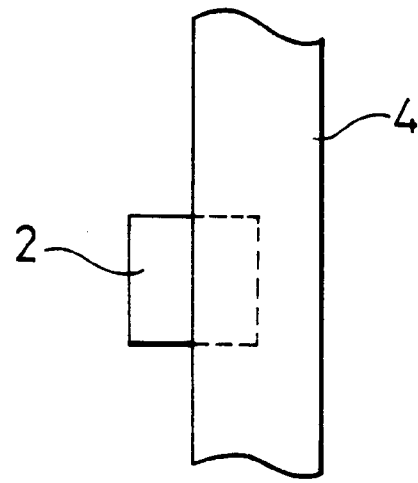
FIG. 1c is a plan view schematically showing a general wiring connection portion in an example in which a shift in position between the hole and the upper wiring is caused in FIG. 1b.
Figure 2C:
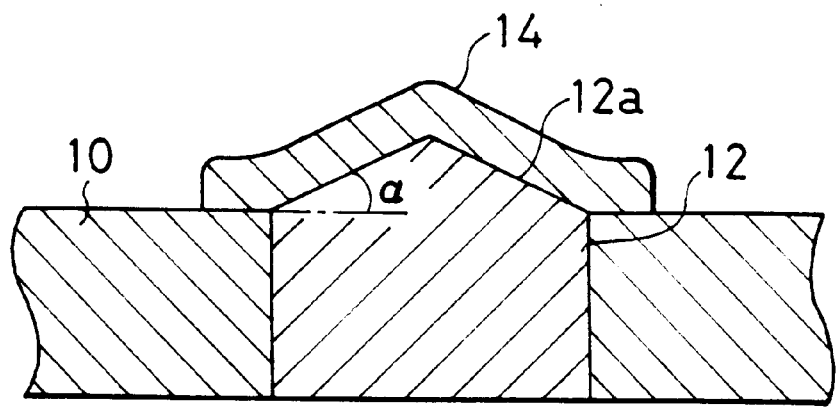
FIG. 2c is a cross-sectional view showing a buried conductive material in a connection portion in the present invention and showing connection between the buried conductive material and an upper wiring.

For example, an opening portion of the buried conductive material 12 in each of the contact and through holes is formed as shown in FIG. 2c. In FIG. 2c, an upper face 12a of the buried conductive material 12 is formed in a conical shape. α is set to an angle formed between a surface of the insulating film 10 and a conical slanting face of the upper face 12a. When an upper wiring material or member 14 has a constant shape irrespective of the shape of the buried conductive material 12, a contact area between the buried conductive material 12 and the upper wiring member 14 is equal to $1/\cos\alpha$ times a contact area between the buried conductive material 12 and the upper wiring member 14 provided when an upper face of the buried conductive material 12 is a flat face. This relation is held even when a position of the upper wiring member 14 is shifted from each of the contact and through holes. For example, when α is set to 45°, the contact area is increased by about 40% in comparison with a case in which the buried conductive material 12 has an upper flat face. As a result, it is possible to improve reliability with respect to the position shift explained with reference to FIG. 1c.

Figure 3A:
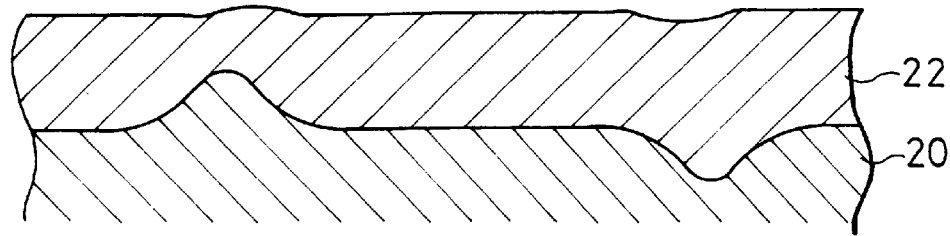
FIG. 3a is a cross-sectional view for explaining the present invention using a change in resist sensitivity in accordance with the thickness of a resist film, and shows that the resist film is formed on an irregular substrate.
Figure 3B:
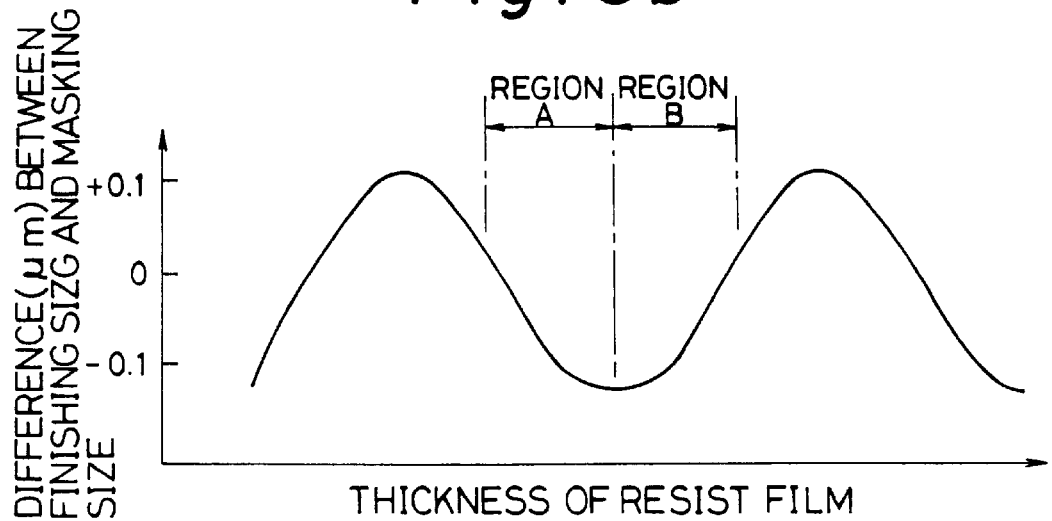
FIG. 3b is a graph for explaining the present invention using a change in resist sensitivity in accordance with the thickness of a resist film, and shows a change in pattern size with respect to the thickness of the resist film.

When a resist film is formed on a flat surface, the resist film has a uniform thickness. In contrast to this, when a substrate 20 for the resist film has local irregularities as shown in FIG. 3a, the resist film becomes thick by an influence of resist fluidity on a concave portion of the substrate 20 in comparison with a flat portion thereof. Conversely, the resist film becomes thin on a convex portion of the substrate 20. A resist sensitivity is periodically changed by interference of exposed light on front and rear faces of the resist film with respect to the thickness of the resist film. This change is called a swing curve phenomenon. For example, FIG. 3b is a graph showing a change in finishing size of a resist pattern in a line-and-space with respect to a change in thickness of the resist film of a positive type when an exposure amount (time) of the resist film is set to be constant. This change is also called one swing curve. A difference between the finishing size and a masking size depends on the exposure amount. For example, the finishing size is changed about ±0.1 µm with respect to the change in thickness of the resist film. A period of this change in the finishing size is approximately in conformity with λ/2n. In this case, λ and n are respectively set to a wavelength of exposed light and a refractive index of the resist film.

Figure 3C:
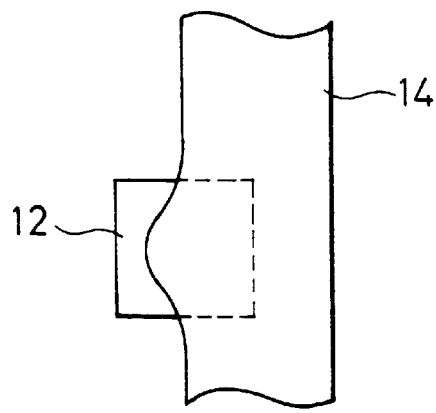
FIG. 3c is a plan view showing a pattern of the upper wiring in the present invention using a change in resist sensitivity in accordance with the thickness of a resist film.

The present invention uses a phenomenon in which the size of a resist pattern is changed in accordance with the thickness of the resist film. In the present invention, no contact area between the buried conductive material and the upper wiring member is greatly reduced even when a shift in position of the upper wiring is caused in each of a contact hole portion and a through hole portion. When the buried conductive material is formed in a convex shape, the thickness of the resist film on this buried conductive material becomes thinner than that on a flat portion of the conductive material if the thickness of the resist film on the flat portion is set to a value in a region A shown in FIG. 3b. Accordingly, when a position of the upper wiring member is shifted from each of the contact hole portion and the through hole portion, a width of the upper wiring member 14 is widened on only the buried conductive material 12 as shown in FIG. 3c. Accordingly, it is possible to provide a reliable wiring structure with respect to the shift in position of the upper wiring member.

In contrast to this, when the buried conductive material is formed in a concave shape, the thickness of the resist film on this buried conductive material becomes thicker than that on a flat portion of the conductive material if the thickness of the resist film on the flat portion is set to a value in a region B shown in FIG. 3b. Accordingly, the width of a resist pattern is widened on the buried conductive material. In this case, the wiring structure shown in FIG. 3c can be also formed.

When the pattern width of the upper wiring is controlled by using a phenomenon in which a resist sensitivity is periodically changed with respect to the thickness of the resist film, the thickness of the resist film on the buried conductive material greatly depends on the shape of an upper face of the buried conductive material. Accordingly, it is necessary to select an optimum shape of an upper end face of the conductive material with respect to viscosity and thickness of the resist film, etc.

Embodiment 1

An aluminum film is formed on a silicon substrate by a sputtering method such that this aluminum film has a thickness of about 5000 Å. In a condition for forming this aluminum film, a substrate temperature is set to 150° C., an argon gas pressure is set to $2 \times 10^{-3}$ Torr, and RF power is set to 50 W/cm². Next, a silicon oxide film is formed by a plasma CVD method such that this silicon oxide film has a thickness of about 5000 Å. In a condition for forming this silicon oxide film, a substrate temperature is set to 350° C., a flow rate of $SiH_4$ is set to 20 cc/minute, a flow rate of $N_2O$ is set to 100 cc/minute, a flow rate of $N_2$ is set to 50 cc/minute, and RF power is set to 5 W/cm².

The silicon oxide film is coated with a resist for forming a hole pattern and photolithography and etching processings are then performed. An RIE method is used in the etching processing and $CHF_3$ gas is used as an etching gas. In an etching condition, a pressure of the etching gas is set to 1 Torr, a flow rate of the etching gas is set to 1 liter/minute, and a substrate temperature is set to 15° C. A hole size in the etching processing is set to 0.3 µm.

A tungsten selective CVD method is used to form an upper end face of a hole portion in a convex shape as a buried conductive material. The selective CVD method can control the shape of a tungsten growing surface by a substrate temperature, gas flow rates and a gas pressure. In a film forming condition in this embodiment, the substrate temperature is set to 250° C., a flow rate of $WF_6$ is set to 10 cc/minute, a flow rate of $H_2$ is set to 500 cc/minute, a flow rate of silane is set to 5 cc/minute, a flow rate of argon is set to 10 cc/minute, and the gas pressure is set to 200 mTorr. A tungsten film is formed until tungsten in an end portion of this tungsten film providing a hole diameter reaches a height approximately equal to that of a planar portion of a silicon oxide film. As a result, a central portion of the tungsten metal is formed in a convex shape and a height from a vertex of the convex portion to the planar portion of the silicon oxide film is equal to about 500 Å from SEM observation.

Embodiment 2

An aluminum thin film is formed on a silicon substrate and a silicon oxide film is formed on this aluminum thin film. A hole pattern is formed in this silicon oxide film by photolithography and etching. These processings are similar to those in the Embodiment 1.

An upper end face of a buried conductive material is formed in a concave shape by using a tungsten blanket CVD method and an etchback method. In the blanket CVD method, the upper end face of the buried conductive material can be formed in a concave shape by changing a flow rate of $WF_6/H_2$ at a forming time of a tungsten film. In a condition for forming the tungsten film, a substrate temperature is set to 450° C., a flow rate of $WF_6$ is set to 80 cc/minute, a flow rate of $H_2$ is set to 1000 cc/minute, a flow rate of $N_2$ is set to 200 cc/minute, a flow rate of argon is set to 2000 cc/minute, and a gas pressure is set to 200 mTorr. The tungsten film is continuously formed until a hole of the conductive material is completely buried by tungsten and the tungsten film reaches an upper portion of the hole. Thereafter, etchback processing is performed until a height of the tungsten film in an end portion of the hole is equal to the height of a planar portion of the silicon oxide film. At this time, an upper end face of the buried tungsten is formed in a conical shape opening upward and the height of a concave portion of the buried tungsten from the planar portion of the silicon oxide film is equal to about 400 Å from SEM observation.

COMPARISON EXAMPLE

An upper end face of a buried conductive material is formed in a flat shape as a sample to compare the present invention with a general technique. The tungsten blanket CVD method and the etchback method are used as a method for forming the buried conductive material. In a method for forming a tungsten film, a substrate temperature is set to 450° C., a flow rate of $WF_6$ is set to 50 cc/minute, a flow rate of $H_2$ is set to 300 cc/minute, a flow rate of $N_2$ is set to 300 cc/minute, a flow rate of argon is set to 2000 cc/minute, and a gas pressure is set to 100 mTorr. The tungsten film is continuously formed until a hole is completely buried by tungsten and the tungsten film reaches an upper portion of the hole. Thereafter, etchback processing is performed until a height of the tungsten film in an end portion of the hole is equal to the height of a planar portion of a silicon oxide film. In a condition of the etchback processing, a flow rate of $SF_6$ is set to 80 cc/minute, a flow rate of argon is set to 30 cc/minute, RF power is set to 3W/cm², and a gas pressure is set to 150 mTorr. At this time, an upper end face of the tungsten buried layer is formed in a planar shape.

In the Embodiments 1 and 2 and the comparison example, a buried metal is formed in a hole of the silicon oxide film and an upper wiring metal is thereafter formed. An aluminum thin film is used as the upper wiring metal. A forming condition of the aluminum thin film is similar to that of the above-mentioned lower aluminum thin film. The aluminum thin film is set to have a thickness of about 4000 Å.

A positive type resist TSCR-55IR as a trade name of TOKYO OHKA (applied chemistry) Co., Ltd. is used as a resist for patterning the upper aluminum film. The thickness of a resist film and an exposure condition are set by the following four kinds in consideration of a swing curve of the resist. The thickness of the resist film is provided on a flat portion. An exposure amount (time) is shows an optimum value in the flat portion provided when a masking size and a resist finishing size are equal to each other. A wavelength of exposed light is set to 365 nm.

Figure 4:
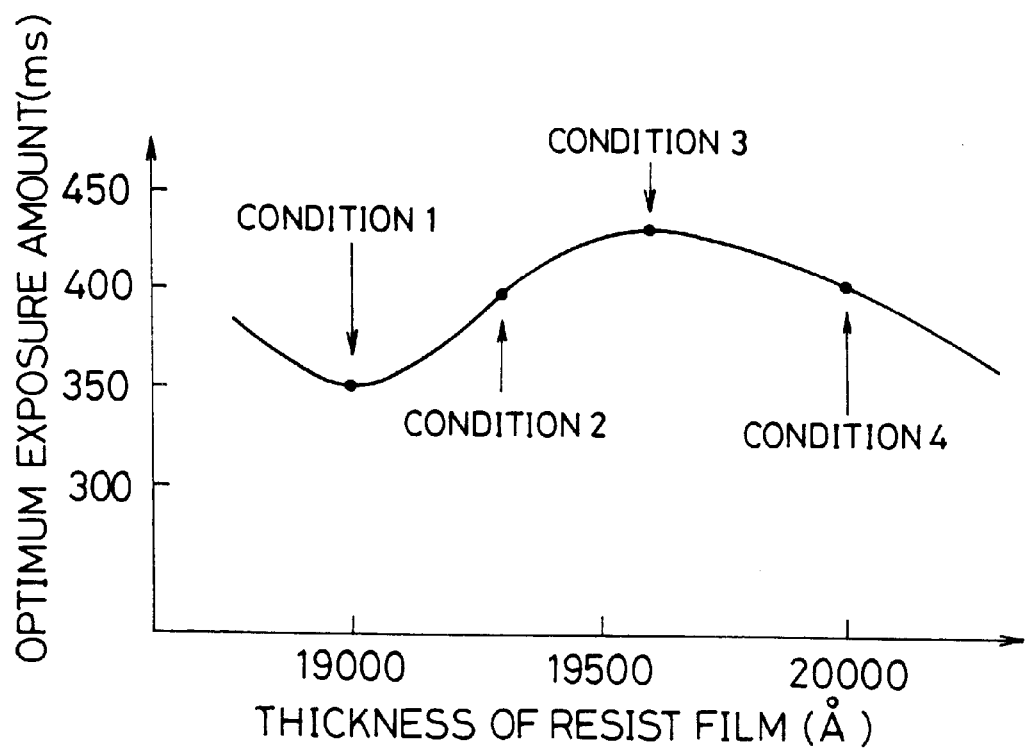
FIG. 4 is a graph showing an optimum exposure amount (time) of the resist film in an embodiment of the present invention when the thickness of the resist film is changed.

Resist condition 1: resist film thickness 19000 Å, exposure amount (time) 350 msec Resist condition 2: resist film thickness 19300 Å, exposure amount (time) 400 msec Resist condition 3: resist film thickness 19600 Å, exposure amount (time) 430 msec Resist condition 4: resist film thickness 20000 Å, exposure amount (time) 400 msec FIG. 4 is a graph showing these values of the optimum exposure amount (time) of the resist film when the thickness of the resist film is changed. An axis of ordinate shows the optimum exposure amount and an axis of abscissa shows the thickness of the resist film. A condition 1 shows a film thickness at a local maximum value of a swing curve shown in FIG. 4. The optimum exposure amount is increased when the film thickness is slightly thicker or thinner than this local maximum value. With respect to a condition 2, the optimum exposure amount is increased when the film thickness is slightly thicker than a film thickness provided in this condition 2. In contrast to this, the optimum exposure amount is decreased when the film thickness is slightly thinner than the film thickness provided in this condition 2. With respect to a condition 3, the optimum exposure amount is reduced when the film thickness is thicker or thinner than a film thickness provided in this condition 3. With respect to a condition 4, the optimum exposure amount is decreased when the film thickness is slightly thicker than a film thickness provided in this condition 4. In contrast to this, the optimum exposure amount is increased when the film thickness is slightly thinner than the film thickness provided in this condition 4.

Figure 5A:
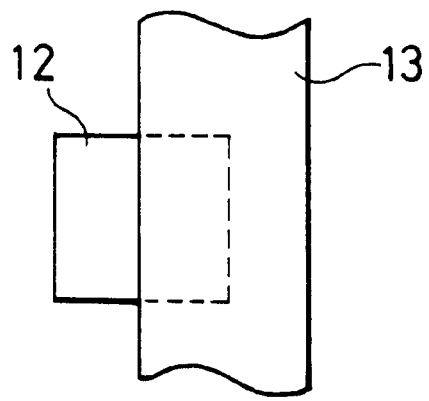
FIG. 5a is a plan view showing effects of the present invention in a state in which a hole portion and a mask for the upper wiring are shifted from each other.
Figure 5B:
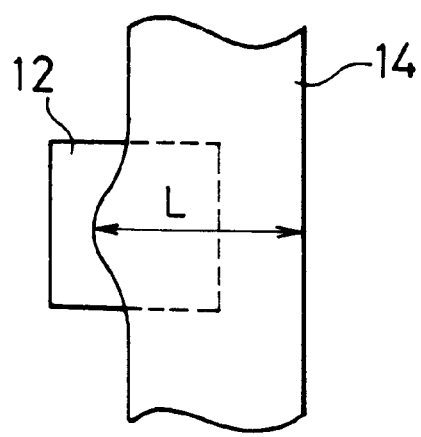

In sizing of the upper wiring metal, a mask having 0.3 μm in width is used at an optimum exposure time in the flat portion. As shown in FIG. 5a, a hole position is shifted by 0.15 μm from a position of the upper wiring to confirm effects of the present invention. After development using photolithography, the upper wiring metal is etched by using an RIE method. After the resist is removed from the upper wiring metal, the length or width L (see FIG. 5b) of a wiring pattern in a central position of the hole is measured to confirm the effects of the present invention. In an etching condition of the upper wiring metal, a gas pressure is set to $1 \times 10^{-2}$ Torr, a flow rate of $CCl_4$ is set to 20 cc/minute, a flow rate of $Cl_2$ is set to 40 cc/minute, a flow rate of $N_2$ is set to 50 cc/minute, and RF power is set to 5 W/cm².

Table 1 shows manufacturing results of the upper wiring metal, etc.

TABLE 1

| Sample No. | shape of buried conductive material | resist condition | size of wiring pattern (μm) |
|---|---|---|---|
| 1 | Embodiment 1 | 1 | 0.33 |
| 2 | Embodiment 1 | 2 | 0.25 |
| 3 | Embodiment 1 | 3 | 0.27 |
| 4 | Embodiment 1 | 4 | 0.37 |
| 5 | Embodiment 2 | 1 | 0.34 |
| 6 | Embodiment 2 | 2 | 0.36 |
| 7 | Embodiment 2 | 3 | 0.28 |
| 8 | Embodiment 2 | 4 | 0.25 |
| 9 | Comparison example | 1 | 0.30 |
| 10 | Comparison example | 2 | 0.31 |
| 11 | Comparison example | 3 | 0.29 |
| 12 | Comparison example | 4 | 0.31 |

As can be seen from these results, no wiring width is almost changed with respect to the thickness of the resist film in the case of a buried shape in the comparison example. In contrast to this, in resist conditions 1 and 4 in the Embodiment 1, the pattern width of the upper wiring metal on the buried metal is widened in comparison with the comparison example. Further, in resist conditions 1 and 2 in the Embodiment 2, the pattern width of the upper wiring metal on the buried metal is widened in comparison with the comparison example. This is because the thickness of the resist film on the buried metal is considered to be set to a thickness for increasing the optimum exposure amount in comparison with the flat portion.

In resist conditions 2 and 3 in the Embodiment 1 and resist conditions 3 and 4 in the Embodiment 2, the pattern width is narrowed in comparison with the comparison example. This is because since the thickness of the resist film on the buried metal is considered to be set to a thickness for decreasing the optimum exposure amount in comparison with the flat portion.

Accordingly, a contact area between the conductive material and the upper wiring metal is increased and reliability of the wiring metal is improved by forming a contact portion of the buried conductive material coming in contact with the upper wiring in a convex or concave shape. Further, it is possible to obtain a reliable wiring with respect to a shift in patterning position by suitably selecting the thickness of the resist film when the upper wiring metal is patterned. Likewise, in the case where a negative type resist is used on patterning the upper wiring metal, it is possible to obtain the same result by suitably selecting the thickness of the resist film when the upper wiring metal is patterned, namely, by setting the thickness of the resist film on the buried metal to a value near a local minimum point of a swing curve.

In the semiconductor device of the present invention, the contact portion of the buried conductive material coming in contact with the upper wiring member is formed in a convex or concave shape. Accordingly, the contact area between the buried conductive material and the upper wiring member can be increased and wiring reliability of the semiconductor device is improved.

Since materials of the buried conductive material and the upper wiring member are different from each other, an etching speed of the buried conductive material can be reduced even when a positioning shift is caused in patterning of an upper wiring metallic film. Accordingly, reliability of a connection portion is improved.

In the manufacturing method of the present invention, in the case of a positive type resist, the thickness of a resist film in a portion above the hole is set to a value near a local maximum point of a swing curve. On the other hand, in the case of a negative type resist, the thickness of a resist film in a portion above the hole is set to a value near a local minimum point of a swing curve. Accordingly, a width of the upper wiring member on the buried conductive material can be widened even when a shift in position between the buried conductive material and the upper wiring member is caused. Therefore, a contact area between the buried conductive material and the upper wiring member can be increased so that reliability of a semiconductor element can be improved.

Many widely different embodiments of the present invention may be constructed without departing from the spirit and scope of the present invention. It should be understood that the present invention is not limited to the specific embodiments described in the specification, except as defined in the appended claims.

What is claimed is:

1. A manufacturing method of a semiconductor device for forming a connection portion comprising:

depositing an insulating film on a lower wiring or a semiconductor element and forming a hole in a portion of the insulating film for forming a connection portion between the lower wiring and an upper wiring formed later;

forming a first metal within said hole and burying said hole by the first metal such that the height of the first metal in an end portion of a hole opening portion is approximately equal to the height of said insulating film in a planar portion thereof and a central portion of the hole opening portion is formed in a convex or concave shape;

depositing a film of a second metal different from the first metal on said first metal and said insulating film;

forming a resist film on said second metal film and patterning the resist film to form the upper wiring; and etching and patterning said second metal film with said resist pattern as a mask so as to form the upper wiring, wherein a thickness of said resist film in a portion situated above said hole is different from that in another portion and is set to a value near a local maximum point of a swing curve in the case of a positive type resist.

2. A manufacturing method of a semiconductor device for forming a connection portion comprising:

depositing an insulating film on a lower wiring or a semiconductor element and forming a hole in a portion of the insulting film for forming the connection portion between the lower wiring and an upper wiring formed later;

forming a first metal within said hole and burying said hole by the first metal such that the height of the first metal in an end portion of a hole opening portion is approximately equal to the height of said insulating film in a planar portion thereof and a central portion of the hole opening portion is formed in a convex or concave shape;

depositing a film of a second metal different from the first metal on said first metal and said insulating film;

forming a resist film on said second metal film and patterning the resist film to form the upper wiring; and etching and patterning said second metal film with said resist pattern as a mask thereby to form the upper wiring, wherein a thickness of said resist film in a portion situated above said hole is different from that in another portion and is set to a value near a local minimum point of a swing curve in the case of a negative type resist.

* * * * *